(12) United States Patent
Masleid (10) Patent No.: US 8,385,150 B2
(45) Date of Patent: Feb. 26, 2013

(54) DELAY EFFICIENT GATER REPEATER

(75) Inventor: Robert P. Masleid, Monte Sereno, CA (US)

(73) Assignee: Oracle International Corporation, Redwood City, CA (US)

( * ) Notice: Subject to any disclaimer, the term of this patent is extended or adjusted under 35 U.S.C. 154(b) by 172 days.

(21) Appl. No.: 13/040,406

(22) Filed: Mar. 4, 2011

(65) Prior Publication Data
US 2012/0224448 A1    Sep. 6, 2012

(51) Int. Cl.
*G11C 8/00* (2006.01)
(52) U.S. Cl. ............................ 365/230.06; 365/230.08
(58) Field of Classification Search ............. 365/230.06
See application file for complete search history.

(56) References Cited

U.S. PATENT DOCUMENTS

| | | | | |
|---|---|---|---|---|
| 4,194,130 A | * | 3/1980 | Moench | 326/106 |
| 4,514,829 A | * | 4/1985 | Chao | 365/230.06 |
| 4,843,261 A | * | 6/1989 | Chappell et al. | 326/108 |
| 5,351,217 A | * | 9/1994 | Jeon | 365/230.06 |
| 5,363,338 A | * | 11/1994 | Oh | 365/230.06 |
| 5,410,508 A | * | 4/1995 | McLaury | 365/189.09 |
| 5,978,254 A | * | 11/1999 | McAdams et al. | 365/149 |
| 6,538,955 B2 | * | 3/2003 | Kohno | 365/230.06 |
| 7,227,806 B2 | * | 6/2007 | Abedifard | 365/230.06 |
| 7,639,545 B2 | * | 12/2009 | Morein | 365/189.05 |

* cited by examiner

*Primary Examiner* — Son Mai
(74) *Attorney, Agent, or Firm* — Meyertons, Hood, Kilvin, Kowert & Goetzel, P.C.; Erik A. Heter (57) ABSTRACT

A gater repeater circuit is disclosed. In one embodiment, the circuit includes an activation circuit coupled to receive an input signal and a clock signal and configured to activate an output circuit. The output circuit is configured to drive an output signal. The output circuit includes first and second devices configured to drive the output signal to first and second states, respectively. A feedback circuit is configured to provide a delayed version of the output signal. A deactivation circuit is coupled to receive the clock signal and the delayed version of the output signal, and is configured to, when the clock signal is in the first state, cause the deactivation of an active one of the first and second devices. When the clock is in the second state, the circuit is configured to cause the second device to drive the output signal to the second state.

20 Claims, 4 Drawing Sheets

DELAY EFFICIENT GATER REPEATER

BACKGROUND

1. Field of the Invention

This invention relates to electronic circuits, and more particularly, to repeater circuits.

2. Description of the Related Art

As integrated circuit (IC) technology advances, the speeds at which IC's operate increases while operating voltages generally decrease. As such, the distances at which signals must propagate on a die become an increasingly important factor to consider in IC design. At longer distances, on-die interconnects between a transmitter and a receiver can develop enough resistance and enough capacitance that the signal transition at the receiver can be adversely affected. For example, excessive propagation delay across a long signal interconnect can affect the transition at the receiver in terms of both timing and voltage levels. For example, a signal that propagates too slowly across an interconnect may in some cases not allow sufficient set-up and hold time for the receiver to properly transition from one logic level to another.

In addition to the distances that signals must travel, another factor that must be considered is the number of loads that must be driven. For example, on-chip memory circuits may include a large number of decoder circuits, each of which may include receivers coupled to common transmitter circuits. Thus, a transmitter coupled to an address signal line may be required to drive a corresponding address signal to a number of different receivers each corresponding to a decoder. If a given address signal lacks sufficient drive strength at the receiver, the decoders may not be able to properly decode the correct memory address.

In some cases, extra circuitry may be implemented in an address (or other multi-signal) path to ensure that signals arrive at their intended destinations with sufficient drive strength and within a specified time. Using the address decoder example again, such circuits may ensure that addresses are properly decoded at a given time. For example, static repeater circuits, including two inverters coupled in series, may be used to provide the necessary drive strength. If a clock is to be factored into the path, a circuit such as a NAND gate coupled in series with an inverter may be utilized, with an address signal and a clock signal being inputs to the former. These circuits may provide the drive strength and necessary timing, although some delay may be added to the signal path.

SUMMARY OF THE DISCLOSURE

A gater repeater circuit is disclosed. In one embodiment, the circuit includes an activation circuit coupled to receive an input signal and a clock signal. The circuit further includes an output circuit configured to drive an output signal. The output circuit includes a first device configured to drive the output signal to a first state when the input signal and the clock signal are in the first state and a second device configured to drive the output signal to a second state when at least one of the input signal and the clock signal is in the second state. The activation circuit is configured to activate one of the first and second devices based on and responsive to an input signal transition when the clock signal is in the second state. A feedback circuit is coupled to receive the output signal and configured to provide a delayed version of the output signal. A deactivation circuit is coupled to receive the clock signal and the delayed version of the output signal. The deactivation circuit is configured to, when the clock signal is in the first state, cause the deactivation of an active one of the first and second devices responsive to receiving the delayed version of the output signal.

An integrated circuit is also disclosed. In one embodiment the integrated circuit includes a memory unit having a predecoder coupled to receive address signals and perform a partial decoding operation. The memory unit also includes a decoder configured to drive a selected one of a number of word lines upon completing the decoding operation. A number of gater repeater circuits are coupled between the predecoder and the decoder. When the clock signal is in a first state, each of the gater repeater circuits is configured to convey a corresponding signal received from the predecoder to the decoder. When the clock signal is in a second state, each of the gater repeater circuits is configured to drive its respective output to the second state, irrespective of a corresponding signal received from the predecoder.

BRIEF DESCRIPTION OF THE DRAWINGS

Other aspects of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION

Figure 1:
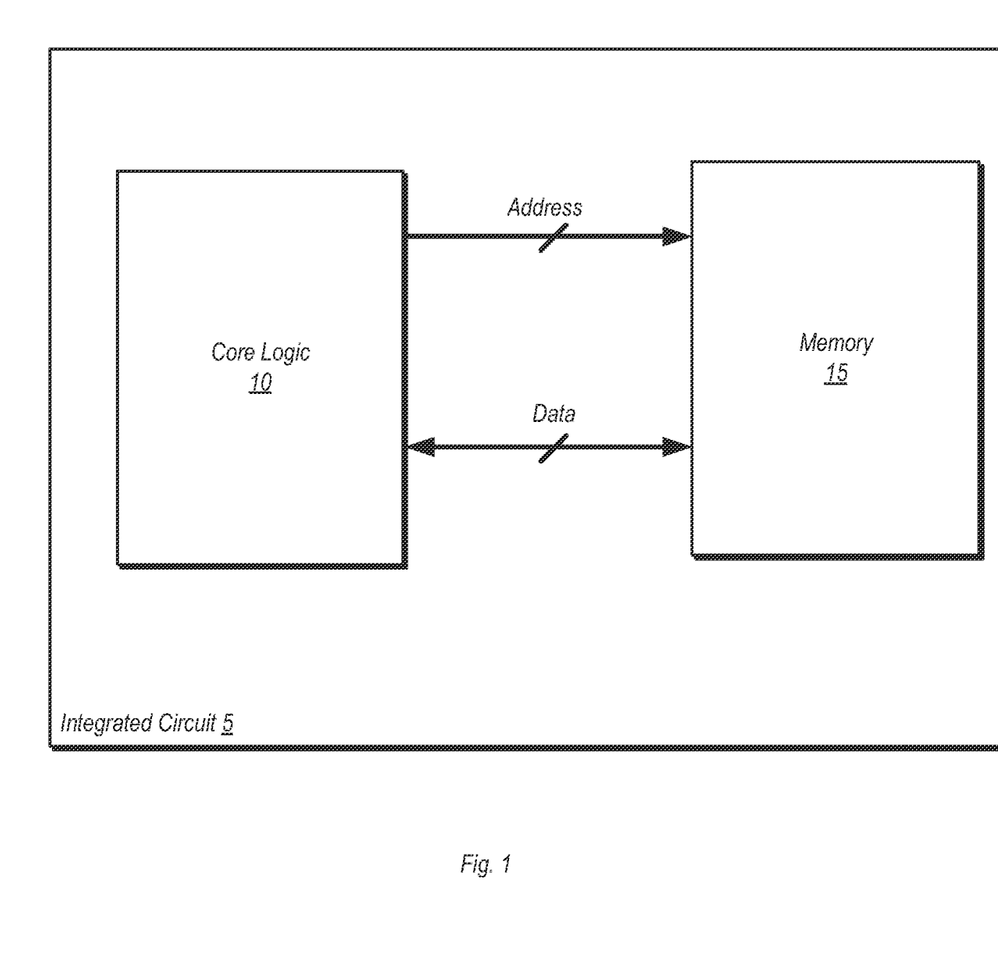
FIG. 1 is a block diagram of one embodiment of an integrated circuit (IC)

Integrated Circuit (IC) with Memory Array:

Turning now to FIG. 1, a block diagram of one embodiment of an IC is illustrated. In the embodiment shown, IC 5 includes a core logic unit 10 and a memory unit 15. IC 5 may include other components (e.g., input/output units, additional instances of core logic 10, etc.), although these units are not illustrated here for the sake of simplicity. Core logic 10 in the embodiment shown may be configured to perform the intended function(s) of IC 5. For example, core logic unit 10 may include one or more processor cores and thus IC 5 may operate as a general-purpose microprocessor.

Memory unit 15 may include one or more on-chip memories used for storing information by core logic unit 10. The memory unit 15 may include one or more memory arrays that may be used as, e.g., cache memory, or any other suitable type. Memory unit 15 in the embodiment shown is coupled to receive address signals via an address bus from core logic unit 10. Memory unit 15 is further coupled to core logic 10 by a bi-directional data bus, and may thus receive data from or provide data to core logic unit 10. Memory unit 15 may include one or more memory types. Such memory types may include (but are not limited to) static random access memory (SRAM), dynamic RAM (DRAM), flash memory, various type of read only memory (ROM), and virtually any other type of memory that may be implemented on an IC die.

Figure 2:
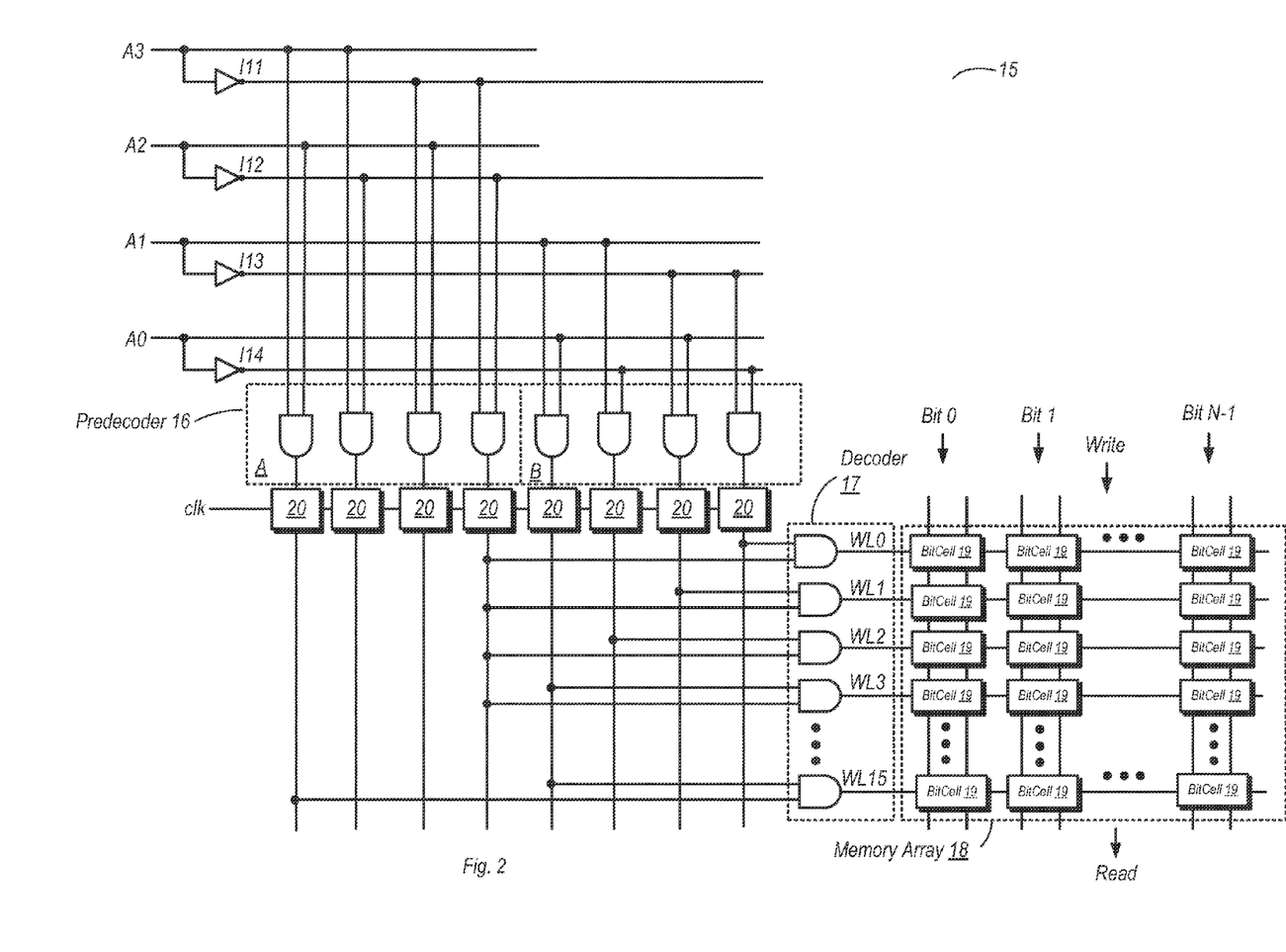
FIG. 2 is block diagram of one embodiment of a memory illustrating an address path.

FIG. 2 is a diagram illustrating the address path in one embodiment of a memory unit. In the embodiment shown, memory unit 15 includes memory array 18, which is configured to store sixteen N-bit words. It is noted that the size of the memory array 18 is exemplary, and numerous other memory array sizes are possible and contemplated. Memory array 18 includes a number of bit cells 19 arranged in a grid of N bits across (bit 0 to bit N-1) and sixteen rows down. Each bit cell 19 in the embodiment shown is configured to store a single bit, and may be implemented using one of many well-known types of bit cell circuitry. A given row of bit cells 19 may become active and transparent for read or write operations when the word line corresponding to that row is asserted.

A given word line may be asserted responsive to memory unit 15 receiving an address corresponding to that word line. In the embodiment shown, memory unit 15 is configured to receive four address bits, A3-A0. Inverters I11-I14 may be used to produce respective complements of address bits A3-A0. The address bits and their corresponding complements may be received by predecoder 16. In the embodiment shown, predecoder 16 includes a number of AND gates which are divided into groups A and B. Each of these groups effectively forms a 1-of-4 one-hot multiplexer. In other words, only one AND gate of group A and only one AND gate of group B will assert their respective outputs (as a logic 1 in this case) responsive to receiving a given address. As predecoder 16 is configured to only perform a partial predecoder operation (decoder 17 may perform the remaining portion of the decode), each AND gate of group A is coupled to receive as inputs one of address bit A3 and its complement and one of address bit A2 and its complement. Similarly, each AND gate of group B is coupled to receive as inputs one of address bit A1 and its complement and one of address bit A0 and its complement.

In the embodiment shown, the output of each AND gate of predecoder 16 is coupled to a corresponding gater repeater circuit 20. Each gater repeater circuit 20 is further coupled to receive a clock signal. The arrangement of gater repeaters 20 in the example shown may provide two different functions. A first function that may be provided is to synchronize the final address decode and word line assertion for a selected address of memory array 18. A second function that may be provided is to provide sufficient drive strength to drive multiple loads, since is may not be practical for each AND gate of predecoder 16 to drive the same number of loads. In this particular embodiment, each gater repeater 20 is coupled to drive four different loads of decoder 17. In some embodiments, additional memory arrays in the same address space may also be provided. In such embodiments, each gater repeater circuit 20 is arranged to drive additional loads over those explicitly shown here. As will be discussed in further detail below, each gater repeater may include devices configured to provide the necessary drive strength to drive these multiple loads over long signal paths. The circuit is referred to as a "gater" repeater circuit in this case due to the gating function provided by utilizing the clock signal in addition to the repeater function also provided.

The outputs provided by each gater repeater 20 in the embodiment shown are dependent on the state of the clock signal. When the clock signal is in a first state (e.g., high), each gater repeater 20 is configured to convey the state of the signal received from a corresponding AND gate of predecoder 16. Thus, if a given AND gate of each of groups A and B of predecoder 16 is asserting a respective signal, that signal may propagate through its respective gater repeater 20 to decoder 17. When the clock signal is in a second state (e.g., low), each gater repeater 20 in the embodiment shown is configured to drive its output to a predetermined state (e.g., low) regardless of its respectively received input signal from predecoder 16.

Decoder 17 in the embodiment shown is coupled to receive the signals output by gater repeaters 20. Similar to predecoder 16, decoder 17 includes a number of AND gates. Each AND gate of decoder 17 is a 2-input AND gate coupled to receive a first input from a gater repeater 20 associated with group A of predecoder 16, and a second input from a gater repeater 20 associated with group B of predecoder 16. Each AND gate of decoder 17 is configured to assert its respective word line when both of its inputs are asserted (e.g., logic 1, or high in this embodiment). For example, if both inputs to the AND gate associated with word line 1 ('WL1') are asserted, word line 1 is asserted. This corresponds to an address of 0001, or A3=0, A2=0, A1=0, and A0=1. The resultant output from predecoder 16 may be conveyed by gater repeaters 20 when the clock signal is high in this embodiment.

When the clock signal is low in the embodiment shown, each gater repeater 20 is configured to drive its respective output low. Accordingly, the input to each AND gate of decoder 17 is low when the clock signal is low, and thus no word lines are asserted. Thus, as noted above, gated repeaters 20, in additional to providing the ability to drive a large number of loads, are also arranged to synchronize the address decode operation in this embodiment.

In general, various embodiments of gater repeater 20 may be used in applications where it may be necessary for a signal to be fanned out to a large number of loads, and wherein gating (i.e., inhibit, at certain times, the input signal from propagating through to the output of the circuit) of such a signal is also desirable. An embodiment of such a gater repeater circuit will now be discussed in further detail.

Figure 3:
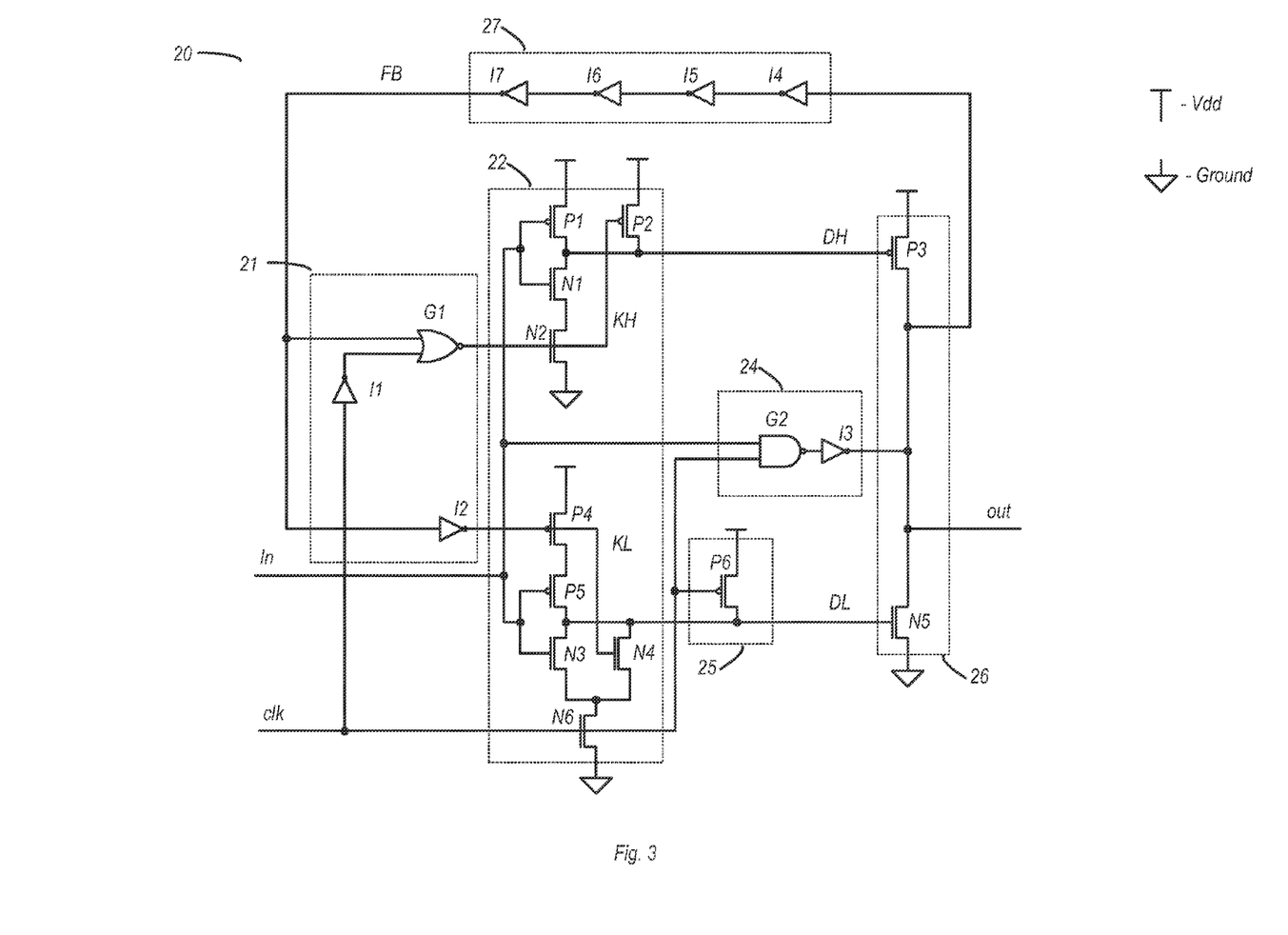
FIG. 3 is a schematic diagram of one embodiment of a gater repeater circuit.

Gater Repeater Circuit:

Turning now to FIG. 3, a schematic diagram of one embodiment of gater repeater circuit 20 is shown. In the illustrated embodiment, gater repeater 20 includes a deactivation circuit 21, and activation circuit 22, a keeper circuit 24, a hold circuit 25, an output circuit 26, and a feedback circuit 27. It is noted that references to specific transistors in this embodiment that are designated with an 'N' are n-channel metal oxide semiconductor (NMOS) transistors, while those designated with a 'P' are p-channel metal oxide semiconductor (PMOS) transistors. The arrangement shown here is not intended to be limiting, and thus embodiments of the circuit utilizing other types of transistors or opposite polarities in some cases are possible and contemplated. Furthermore, embodiments of the circuit that are implemented in technologies other than complementary metal oxide semiconductor (CMOS) are possible and contemplated. For example, embodiments of the illustrated circuit implemented with graphene or gallium arsenide are possible and contemplated and may thus fall within the scope of this disclosure.

Activation circuit 22 in the embodiment shown is coupled to receive an input signal via an input node ('In') and a clock signal via a clock node ('clk'). Activation circuit 22 includes a pull-down stack including transistors N1 and N2, which are coupled in series between node DH and ground. When transistors N1 and N2 are active at the same time, node DH is pulled down toward ground, thereby causing the activation of transistor P3 of output circuit 26. Transistor N1 may be activated when the input signal is high. Transistor N2 may be activated when the output of NOR gate G1 (node KH) of deactivation circuit 21 is high.

Activation circuit 22 also includes a pair of pull-up transistors P1 and P2 coupled in parallel between node DH and Vdd, which is the voltage supply plane in this embodiment. Activation of either of P1 or P2 in this embodiment results in node DH being pulled high, thereby inhibiting (or deactivating) transistor P3. Transistor P2 may be activated when NOR gate G1 drives node KH low. Transistor P1 may be activated when the input signal is low.

A pull-up stack including transistors P4 and P5, coupled in series between node DL and Vdd is also implemented in activation circuit 22. When both of these devices are active, node DL is pulled toward Vdd, thereby causing the activation of transistor N5 of output circuit 26. Transistor P5 is activated when the input signal is low, while transistor P4 is activated when node KL (output by inverter I2 of deactivation circuit 21) is low. A pull-down path may be provided between node DL when transistor N6 is active at the same time at least one of transistors N3 and N4 is active. Transistor N3 is activated responsive to a high input signal on the input node, while transistor N4 is activated responsive to a high on node KL. Transistor N6 is active when the clock signal is high. When node DL is pulled low, transistor N5 is inhibited from activation.

As noted above, output circuit 26 includes transistors P3 and N5, each of which are coupled to the output node. Transistor P3 is configured to, when active, drive an output signal high on the output node. Activation of transistor P3 results from activation the pull-down path between node DH and ground (through N1 and N2). Transistor N5 is configured to, when active, drive the output signal low on the output node. Activation of transistor N5 results from activation of the pull-up path between node DL and Vdd (through transistors P4 and P5). Transistors P3 and N5 in the embodiment shown may be large with respect to other devices of gater repeater 20. Accordingly, the transistors of output circuit 27 may have more drive strength than the other transistors in the circuit. The drive strength of each of transistors P3 and N5 may exceed that of the devices used to implement keeper circuit 24. Thus, for example, if keeper circuit 24 attempts to drive the output node low when P3 is active, the drive strength of the latter will result in the output node being driven high. The high drive strength of these devices may reduce the time required to cause a logical transition on a wire coupled to the output node. Furthermore, the devices may be sized such that the output of gater repeater 20 may be fanned out to a large number of loads.

The output node of gater repeater 20 is coupled to an input of feedback circuit 27. In the embodiment shown, feedback circuit 27 is implemented using four series-coupled inverters, I4-I7. The series-coupled inverters of feedback circuit 27 in the embodiment shown serve to generate a delayed version of the output signal driven on the output node. Thus, at a delay time subsequent to the occurrence of a logical transition on the output node, a corresponding transition occurs on the output of feedback circuit 27. The output of feedback circuit 27, node FB, is coupled to deactivation circuit 21.

Deactivation circuit 21 in the embodiment shown includes two components, NOR gate G1 and inverter I2, coupled to receive the delayed version of the output signal generated by feedback circuit 27. In addition, inverter I1 is coupled to receive the clock signal and is configured to provide a complement of the clock signal to NOR gate G1. When the clock signal is low, NOR gate G1 outputs a logic low, irrespective of the state of node FB. When the clock signal is high, the output of NOR gate G1 follows the state of node FB. The output of NOR gate G1, node KH, is coupled to respective gate terminals transistors N2 and P2 of activation circuit 22.

The output of inverter I2 is coupled to node KL, is coupled to respective gate terminals of transistors P4 and N4.

When the clock signal is high, a low-to-high transition on the output node (resulting from the activation of transistor P3) causes a resultant transition on node FB that in turn causes NOR gate G1 to drive node KH low. When node KH is driven low, transistor P3 is activated and transistor N2 is deactivated. This results in node DH transitioning from low to high, thereby deactivating transistor P3. In addition, the resultant transition on node FB causes node KL to fall low, with this low being driven to respective gate terminals of transistors P4 and N4.

A high-to-low transition on the output node (resulting from the activation of transistor N5), when the clock signal is high, results in a subsequent (after the delay induced by feedback circuit 27) high-to-low transition on node FB. This in turn causes inverter I2 to drive node KL high. When node KL is driven high, transistor P4 is deactivated, thus blocking the pull-up path between node DL and Vdd. A high on node KL also causes the activation of transistor N4. Since transistor N6 is active when the clock is active, node DL is pulled low, and transistor N5 is deactivated. The low on node FB also causes NOR gate G1 to drive node KH high, thereby activating transistor N2.

When neither of the devices of output circuit 27 is driving the output node, keeper circuit 24 may hold the most recent input state when the clock signal is high. Keeper 24 includes NAND gate G2 and inverter I3, with the output of the former being coupled to the input of the latter. NAND gate G2 is coupled to receive the input signal and the clock signal as its inputs. When the clock signal is high, the current state of the input signal propagates through keeper circuit 24 to the output node, and may be held even if both devices of output circuit 27 are inactive. If the clock signal is low, keeper circuit 24 drives a low onto the output node, irrespective of the state of the input signal.

Gater repeater 20 also includes hold circuit 25. In this particular embodiment, hold circuit 25 is implemented with transistor P6, which includes a gate terminal coupled to receive the clock signal. When the clock signal is low, transistor P6 is active, and thus node DL is pulled high, activating transistor N5. Thus, gater repeater 20 is configured such that transistor N5 drives the output node low whenever the clock signal is low, irrespective of the state of the input signal. When the clock signal is high, transistor P6 is inactive, and thus node DL may be driven low or high according to the states of the corresponding pull-up (P4 and P5) and pull-down (N3, N4, and N6) networks of activation circuit 22.

Figure 4:
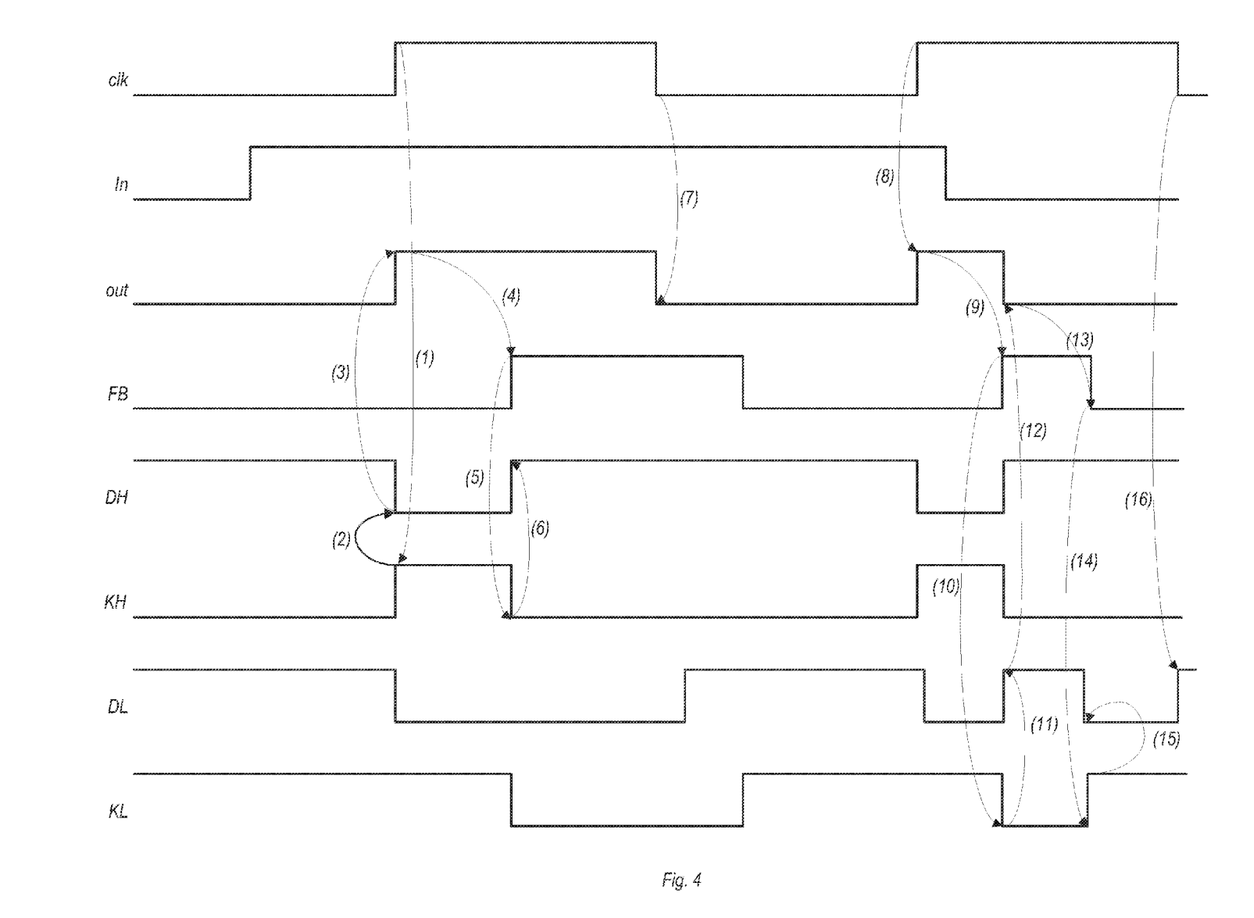
FIG. 4 is a timing diagram illustrating the operation of one embodiment of a gater repeater circuit.

Timing Diagram for Gater Repeater Circuit:

FIG. 4 is a timing diagram illustrating the operation of the embodiment of gater repeater 20 shown in FIG. 3. The initial conditions for this timing diagram include the clock and input nodes both being low. Node FB is low while the output of inverter I1 is high, thus causing NOR gate G1 to drive node KH low. The output node is also low due to the fact that clock is low.

Prior to the clock transitioning high, the input node is driven high in this example. The high on the input signal is received by transistor N1. When the clock transitions high, the output of inverter I1 falls low, thus causing NOR gate G1 to drive a high to the gate of N2 on node KH. The low-to-high transition of the clock signal therefore results in a low-to-high transition of node KH, (1), at this time. The transition of KH to a high state activates N2, thereby completing the pull-down path between node DH and ground. Thus, at (2), the low-to-high transition of node KH causes a high-to-low transition of node DH. As a result, at (3), the high-to-low transition on node DH results in the activation of transistor P3, thereby pulling the output node high.

At a delay time subsequent to the output node completing the low-to-high transition, a corresponding transition occurs, at (4), on node FB. When node FB transitions high, NOR gate G1 drives its output, node KH, low. Thus, at (5), the low-to-high transition of node FB results in KH falling low. When KH falls low, transistor P2 is activated while transistor N2 is deactivated. This eliminates a pull-down path from node DH while replacing it with a pull-up path through transistor P2. Therefor, at (6), the falling low of node KH causes node DH to be pulled high, thereby deactivating transistor P3. The output signal may then be held on the output node by keeper 24.

At (7), the clock signal falls low, thereby causing the output node to be driven low. This results from the activation of transistor P6 when the clock signal falls low, which pulls node DL high and thus activates transistor N5 to drive the output node low. This transition occurs even though the input signal remains high.

At the next rising edge of the clock signal, the input node is still high. Thus, at (8), the rising of the clock signal causes the output node to transition high in the same manner as described above. Shortly after the low-to-high transition of the clock signal, the input node falls low, with the low being received on the gate terminal of transistor P5. At (9), the rising of the clock signal with the input being high also results a low-to-high transition of node FB at a delay time subsequent to the state change of the output node. When node FB transitions high, node KL falls low, at (10). Responsive to node KL falling low, transistor P4 is activated. Thus, at (11), the activation of transistor P4 completes the pull-up path between node DL and Vdd, thus pulling that node high. Responsive to node DL being pulled high, transistor N5 is activated and the output node is pulled low, at (12).

At (13), node FB falls low at a delay time subsequent to the output node being driven low. Responsive to the high-to-low transition of node FB, node KL is driven high at (14). When node KL is driven high, transistor N4 is activated while transistor P4 is deactivated. This cuts off the pull-up path from node DL to Vdd, and creates a pull-down path, through transistors N4 and N6. Therefore, at (15), node DL is pulled low, thereby causing the deactivation of transistor N5. The output node is then held low by the output of keeper circuit 24. At (16), when the clock falls low again, transistor P6 is activated and node DL is pulled high, thereby activating transistor N5.

Although not shown in FIG. 4, the effect of a low-to-high transition of the clock signal when both the input and output nodes are low is now briefly discussed. If the clock transitions high when both the input and output nodes are low, no change of state occurs on nodes DH and KL. At the beginning of such a transition, node DH is pulled high through transistor P1, while node KL is driven high via the output of inverter I2. When the clock transitions high, NOR gate G1 causes a high-to-low transition of node KH, thereby activating transistor P2 and providing a second pull-up path between node DH and Vdd. The low-to-high transition of the clock signal deactivates transistor P6, eliminating the pull-up path between node HL and Vdd. A pull-down path from node DL to ground is provided when the clock transitions high in this situation, through transistors N4 (active due to the high on node KL) and N6.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An electronic circuit comprising:
an activation circuit coupled to receive an input signal and a clock signal;
an output circuit configured to drive an output signal, wherein the output circuit includes a first device configured to drive the output signal to a first state when the input signal and the clock signal are in the first state and a second device configured to drive the output signal to a second state when at least one of the input signal and the clock signal is in the second state, wherein the activation circuit is configured to activate one of the first and second devices based on a transition of the input signal when the clock signal is in the first state;
a feedback circuit coupled to receive the output signal and configured to provide a delayed version of the output signal; and
a deactivation circuit coupled to receive the clock signal and the delayed version of the output signal, wherein the deactivation circuit is configured to, when the clock signal is in the first state, cause the deactivation of an active one of the first and second devices responsive to receiving the delayed version of the output signal.

2. The electronic circuit as recited in claim 1, further comprising a hold circuit coupled to receive the clock signal, wherein the hold circuit is configured to cause the second device to drive the output signal to the second state when the clock signal is in the second state.

3. The electronic circuit as recited in claim 1, wherein the first device is a n-channel metal oxide semiconductor (NMOS) transistor, and wherein the hold circuit comprises a p-channel metal oxide semiconductor (PMOS) transistor having a gate terminal coupled to receive the clock signal, a drain terminal coupled to a gate terminal of the first device, and a source terminal coupled to a voltage plane, wherein the PMOS device is configured to pull the gate terminal of the first device toward a voltage on the voltage plane when the clock signal is in the second state.

4. The electronic circuit as recited in claim 1, further comprising a keeper circuit coupled to receive the input signal and the clock signal, wherein the keeper circuit is configured to drive the output signal at a state equivalent to the input signal when the clock signal is in the first state.

5. The electronic circuit as recited in claim 4, wherein the keeper circuit is configured to drive the output signal to the second state, irrespective of a state of the input signal, when the clock signal is in the second state.

6. The electronic circuit as recited in claim 4, wherein the first and second devices each have a drive strength that exceeds a drive strength of the keeper circuit.

7. An electronic circuit comprising:
an output circuit having a first p-channel metal oxide semiconductor (PMOS) transistor and a first n-channel metal oxide semiconductor (NMOS) transistor, wherein each of the first PMOS and first NMOS transistors are coupled to an output node, wherein the first PMOS transistor is configured to, when active, drive the output node high, and wherein the first NMOS transistor is configured to, when active, drive the output node low;
an activation circuit coupled to receive an input signal and a clock signal, wherein the activation circuit is configured to cause the activation of one of the first PMOS and first NMOS transistors based on a state of the input signal when the clock signal is high;

a deactivation circuit configured to, when the clock signal is low, cause the activation circuit to inhibit activation of the first PMOS transistor; and a hold circuit configured to, when the clock signal is low, cause the first NMOS transistor to be held in an active state.

8. The electronic circuit as recited in claim 7, wherein the hold circuit includes a second PMOS transistor having a gate coupled to receive the clock signal, a drain terminal coupled to a gate terminal of the first NMOS transistor, and a source terminal coupled to a voltage supply plane.

9. The electronic circuit as recited in claim 7, further comprising a feedback circuit coupled to receive an output signal driven on the output node and further coupled to provide a delayed version of the output signal to the deactivation circuit.

10. The electronic circuit as recited in claim 9, wherein the deactivation circuit is configured to inhibit the first PMOS transistor from activation responsive to receiving from the feedback circuit a delayed output signal that is high.

11. The electronic circuit as recited in claim 9, wherein the deactivation circuit is configured to inhibit the first NMOS transistor from activation responsive to receiving from the feedback circuit a delayed output signal that is low.

12. The electronic circuit as recited in claim 7, wherein the activation circuit includes a second NMOS transistor configured to be activated when the input signal is high, and a third NMOS transistor configured to be activated responsive to the deactivation circuit providing a high signal to a gate terminal of the third NMOS transistor, wherein the deactivation circuit is configured to provide the high signal to the gate terminal of the third NMOS transistor responsive to the clock signal transitioning high, and wherein the first PMOS transistor is configured to be activated responsive to the second and third NMOS transistors being concurrently active.

13. The electronic circuit as recited in claim 7, wherein the activation circuit includes a third PMOS transistor configured to be activated when the input signal is low, and a fourth PMOS transistor configured to be activated responsive to the deactivation circuit providing a low signal to a gate terminal of the fourth PMOS transistor, wherein the first NMOS transistor is configured to be activated responsive to the third and fourth PMOS transistors being concurrently active.

14. The electronic circuit as recited in claim 13, wherein the deactivation circuit is configured to provide the low signal to the gate terminal of the fourth PMOS transistor responsive to receiving from the feedback circuit a delayed output signal that is high.

15. The electronic circuit as recited in claim 7, wherein the activation circuit includes a pull-down circuit configured to inhibit activation of the first NMOS transistor when the input signal is high and the clock signal is high, and wherein the activation circuit further includes a pull-up circuit configured to inhibit activation of the first PMOS transistor when the input signal is low.

16. The electronic circuit as recited in claim 7, further comprising a keeper circuit coupled to receive the input signal and the clock signal, wherein the keeper circuit is configured to drive the output node at a state corresponding to a state of the input signal when the clock signal is high, and wherein the keeper circuit is further configured to drive the output node low when the clock signal is low.

17. An integrated circuit comprising:

a memory unit coupled to receive address via a plurality of address lines, wherein the memory unit includes:

a predecoder coupled to each of the plurality of address lines, wherein the predecoder is configured to partially decode a received address in order to generate a plurality of decode signals;

a plurality of gater repeater circuits each coupled to receive, as an input signal a corresponding one of the plurality of decode signals, and further coupled to receive a clock signal, wherein each of the plurality of gater repeater circuits is configured to, when the clock signal is in a first state, drive a corresponding one of a plurality of output signals in a state equivalent to the received one of the plurality of decode signals, and when the clock is in a second state, drive the corresponding one of the plurality of output signals to the second state; and a decoder coupled to receive the plurality of output signals, wherein the decoder is configured to drive one of a plurality of word lines of a memory array based on the plurality of output signals;

wherein each of the plurality of gater repeater circuits includes:

an output circuit having first and second devices, wherein one of the first and second devices is configured to, when the clock signal is in the first state, drive a corresponding one of the plurality of output signals depending on the input signal, and wherein, when the clock signal is in the second state, the second device is configured to drive the corresponding one of the plurality of output signals to the second state.

18. The integrated circuit as recited in claim 17, wherein each of the plurality of gater repeater circuits further includes an activation circuit coupled to receive the clock signal and an input signal, wherein the activation circuit is configured to cause activation of the first device when the clock signal transitions to the first state while the input signal is also in the first state, and further configured to cause activation of the second device when the input signal transitions to the second state while the clock signal is in the first state.

19. The integrated circuit as recited in claim 17, wherein each of the plurality of gater repeater circuits further includes a feedback circuit coupled to receive the corresponding one of the output signals, and a deactivation circuit coupled to receive a delayed version of the corresponding one of the plurality of output signals, wherein the deactivation circuit is configured to, when the clock signal is in the first state, deactivate an active one of the first and second devices of the corresponding one of the plurality of gater repeater circuits responsive to a change of state of the delayed version of the corresponding one of the plurality of output signals.

20. The integrated circuit as recited in claim 17, wherein each of the plurality of gater circuits includes a hold circuit, wherein the hold circuit of each of the plurality of gater circuits is configured to cause its corresponding second device to remain active when the clock signal is in the second state.

* * * * *

UNITED STATES PATENT AND TRADEMARK OFFICE
CERTIFICATE OF CORRECTION

PATENT NO. : 8,385,150 B2
APPLICATION NO. : 13/040406
DATED : February 26, 2013
INVENTOR(S) : Masleid It is certified that error appears in the above-identified patent and that said Letters Patent is hereby corrected as shown below:

On Title page, in column 2, under "Attorney, Agent or Firm", line 1, delete "Kilvin," and insert -- Kivlin, --, therefor.

In the Specification:

In column 3, line 46, before "may" delete "is".

Signed and Sealed this
Fourth Day of June, 2013

Teresa Stanek Rea
*Acting Director of the United States Patent and Trademark Office*